United States Patent [19]

Reiner

[11] 4,031,461

[45] June 21, 1977

[54] SOURCE RELATED POTENTIAL INDICATING CONTINUITY TESTER

[75] Inventor: Carl Casper Reiner, Moline, Ill.

[73] Assignee: Deere & Company, Moline, Ill.

[22] Filed: Jan. 23, 1976

[21] Appl. No.: 651,808

[52] U.S. Cl. .................................. 324/51; 324/133; 340/256

[51] Int. Cl.² ...................................... G01R 31/02

[58] Field of Search ................. 324/29.5, 51, 72.5, 324/133; 340/248 A, 248 B, 248 C, 256, 255

[56] References Cited

UNITED STATES PATENTS

| | | | |
|---|---|---|---|
| 2,229,927 | 1/1941 | Kamper | 324/51 |
| 3,600,678 | 8/1971 | Garrett | 324/133 |
| 3,619,775 | 11/1971 | Naylor et al. | 324/133 X |
| 3,673,588 | 6/1972 | Riff | 324/133 X |
| 3,806,803 | 4/1974 | Hall | 324/133 |
| 3,828,256 | 8/1974 | Liu | 324/133 |
| 3,925,771 | 12/1975 | Stake | 324/133 X |
| 3,944,921 | 3/1976 | Tsuda et al. | 324/133 |

Primary Examiner—Gerard R. Strecker

[57] ABSTRACT

An electrical system fault detector for connection across the source terminals of an electrical system includes circuitry responsive to the relative potentials and current flows between the terminals and a selected point in the electrical system to provide a digital indication of acceptable continuity when current can flow between the selected point and one of the terminals and the potentials thereat are approximately equal. A lack of an indication of acceptable continuity indicates a fault such as an open circuit oran excessive impedance between the selected point and the terminal to which it is connected. An incongruous indication would further indicate a fault such as an incorrect connection or a short circuit. Further circuitry produces and is responsive to an oscillating signal subject to line impedances to distinguish between an open circuit and an excessive impedance.

48 Claims, 10 Drawing Figures

FIG.8
FIG.9
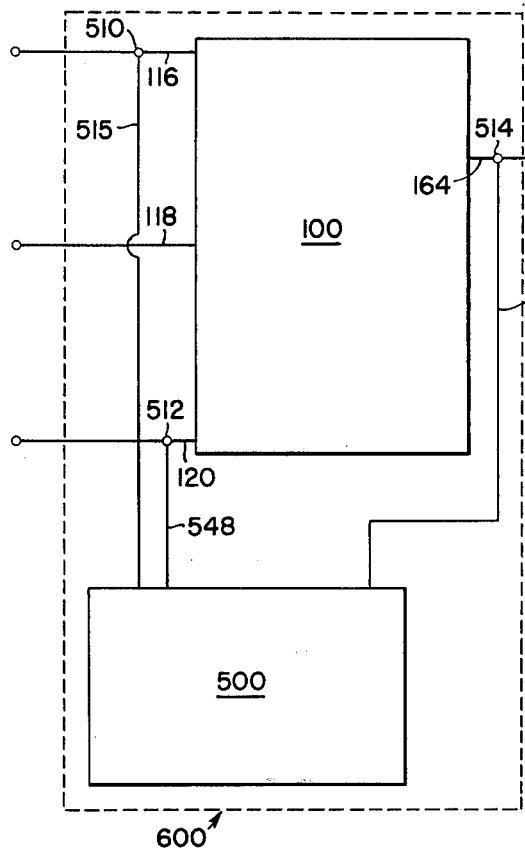
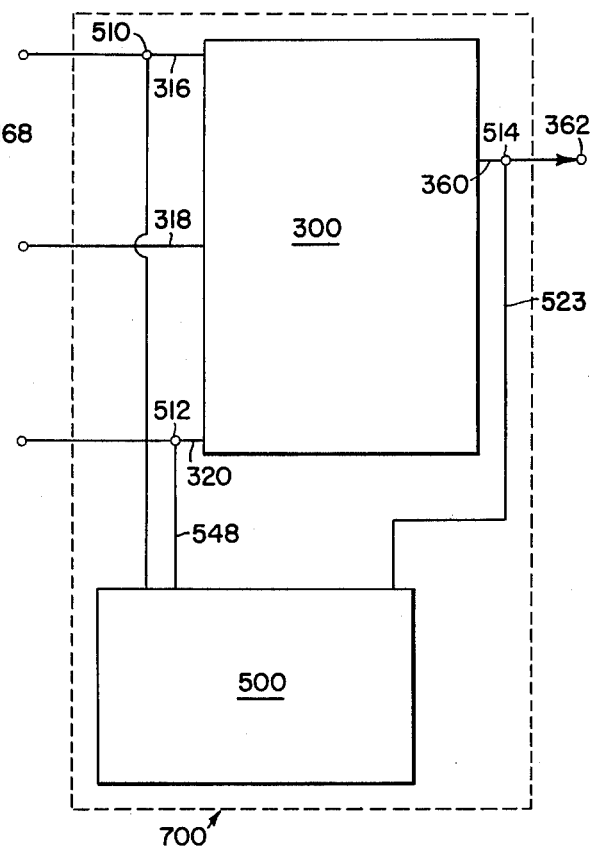
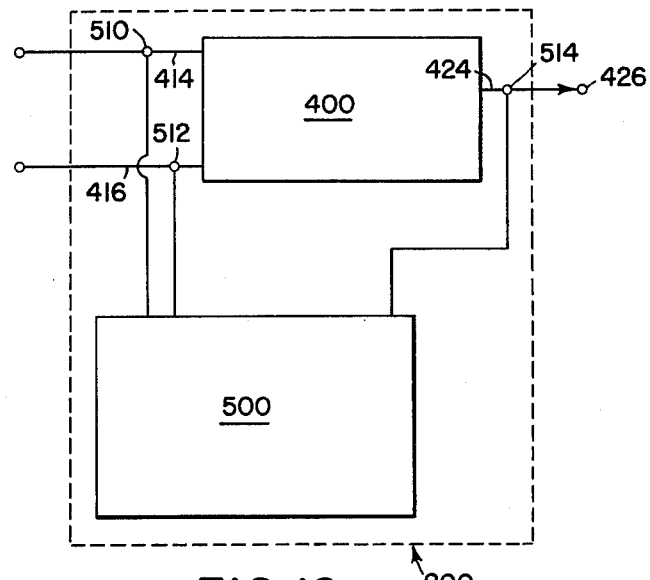
FIG.10

SOURCE RELATED POTENTIAL INDICATING CONTINUITY TESTER

BACKGROUND OF THE INVENTION

The present invention relates generally to potential-continuity testers and more particularly to a relative potential-continuity tester for detecting faults in electrical systems.

In the past, various devices were developed for detecting continuity electrical systems by measuring or sensing the electrical conductance across the ends of the system's component conductors. These devices are generally classified as ohmmeters and one such device is shown in the U.S. Pat. No. 3,328,684 granted to S. Dorris. These devices were subject to a number of problems. First, in complex circuits, both ends of the conductor had to be traced out. Second, the conductor generally had to be disconnected from the remainder of the electrical system to prevent erroneous indications. Third, in large size electrical systems the device required long leads for connection to test conductors whose ends were far apart. And, fourth, poor accessibility to the conductors' ends often resulted in excessive fault detection time.

Various other devices were developed for detecting continuity by measuring or sensing electrical potential across the systems source and related conductors. These devices are generally classified as volt meters and such devices are shown in the U.S. Pat. No. 3,157,870 to J. S. Marino et al, the U.S. Pat. No. 3,311,907 to H. E. Teal, and U.S. Pat. No. 3,072,895 to B. A. Kaufman. These devices had the disadvantage of being incapable of indicating with one reading the difference between the next open or excessive resistance in a faulty circuit and a low source voltage in a good circuit. A second potential reading across the source itself was always necessary before the first reading could be meaningful. Further, while the first and second readings would indicate continuity in a first portion of the system from the source to a always necessary before the first reading could be meaningful. Further, while the first and second readings would indicate continuity in a first portion of the system from the source to a selected point, a third reading would be necessary to determine the continuity of the remainder of the circuit from the selected point back to the source.

A further device which was developed solely for determining voltage levels and thus indirectly continuity for electronic circuits is shown in the U.S. Pat. No. 3,525,939 granted to R. L. Cartmell. This device relates voltages at a selected point to a single, ground, potential and, while useful for detecting continuity in the ground-circuit portions of logic circuits, is subject to the same disadvantages enumerated for volt meter classification devices.

Neither the conductance sensing nor the potential sensing devices related the current flow and potential at the selected point to the electrical system's source to allow fault detection with a single reading.

SUMMARY OF THE INVENTION

The present invention provides an electrical system fault detector responsive to relative potentials and current flows between a source and a selected point in the electrical system to provide digital indications of system condition.

The fault detector includes circuitry which can be used to diagnose good, short, open, excessive resistance, or incorrectly wired electrical systems by moving a single probe along a series of points starting from a non-functioning load and moving towards a source. There is no need to separately determine source potentials or change instrument connections during the diagnostic process. The detector can further be used for either alternating or direct current systems and on those systems having only intermittent or pulse conductivity.

The above and additional advantages of the present invention will become apparent to those skilled in the art from a consideration of the following detailed description of the preferred embodiments when taken in conjunction with the accompanying drawings.

BRIEF DESCRIPTION OF THE DRAWINGS

In the drawings:

FIG. 8 is a schematic illustration of a preferred embodiment of the present invention;

FIG. 9 is a schematic illustration of a first alternate embodiment of the present invention; and FIG. 10 is a schematic illustration of a second alternate embodiment of the present invention.

DESCRIPTION OF THE PREFERRED EMBODIMENTS

Figure 1:
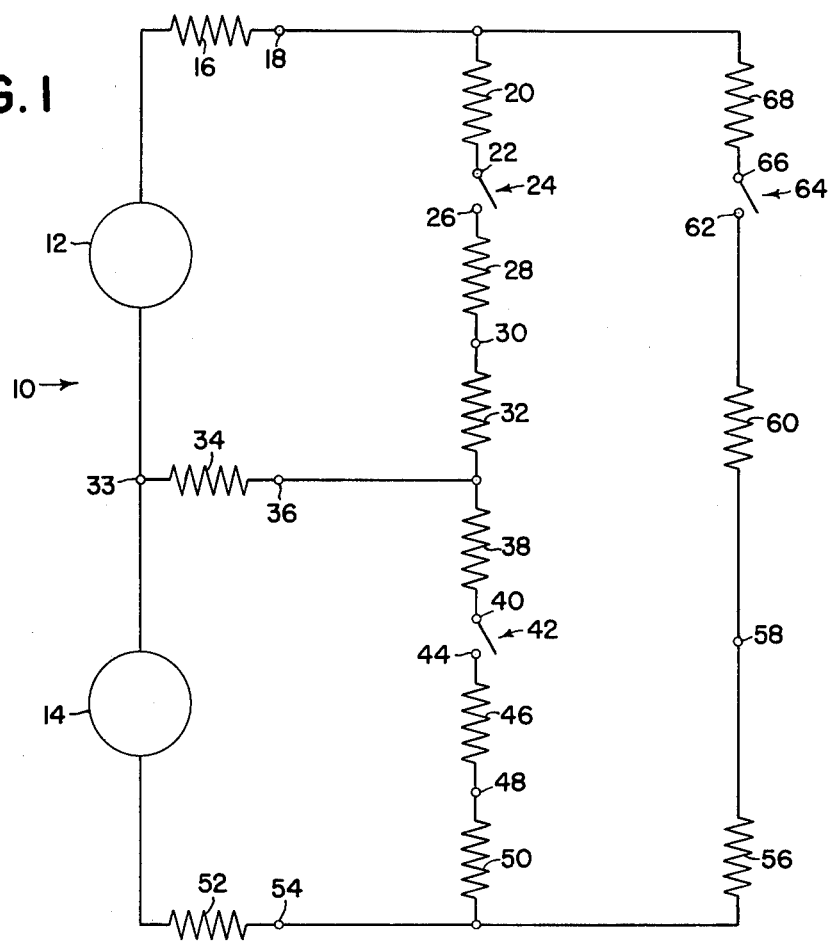
FIG. 1 is a schematic illustration of a typical dual source electrical system.

Referring now to FIG. 1, therein is shown an electrical schematic representative of a typical dual source electrical system 10 having a first and second sources of potential 12 and 14. The sources 12 and 14 represent conventional direct current sources such as batteries or alternating current voltage sources such as electrical A.C. generators. The first source 12 is connected by an internal source impedance 16, representative of the impedances normally present in potential sources, to a terminal 18.

Connected to the terminal 18 is a line impedance 20, representative of the impedances of the various lines and connectors connected to the terminal 18. The line impedance 20 is further connected to a test point 22, typical of the connection points and junction blocks in the system 10. The test point 22 is selectively interconnected by a switch 24 to a test point 26. The test point 26 is connected to a load impedance 28, representative of electrical system loads such as lights, motors, meters, solenoids, relays, accessories, etc. The load impedance 28 in turn is connected to a test point 30 which is connected to a line impedance 32.

The first source 12 is connected to the second source 14 by a connection 33 and the connection 33 is connected by an internal source impedance 34 to a terminal 36. The terminal 36 is connected to the line impedance 32 opposite the test point 30 and to a further line impedance 38. The line impedance 38 is connected to a test point 40. The test point 40 is selectively interconnected by a switch 42 with a test point 44. The test point 44 is connected to a load impedance 46 and thence to a test point 48. The test point 48 is further connected to a line impedance 50 which in turn is connected to a terminal 54. The second source 14 is connected by an internal source impedance 52 to the terminal 54.

Also connected to the terminal 54 is a line impedance 56 which is connected to a test point 58. The test point 58 is connected to a load impedance 60 and thence to a test point 62. A switch 64 selectively interconnects the test point 62 and a test point 66. The test point 66 is connected by a line impedance 68 to the terminal 18.

Figure 2:
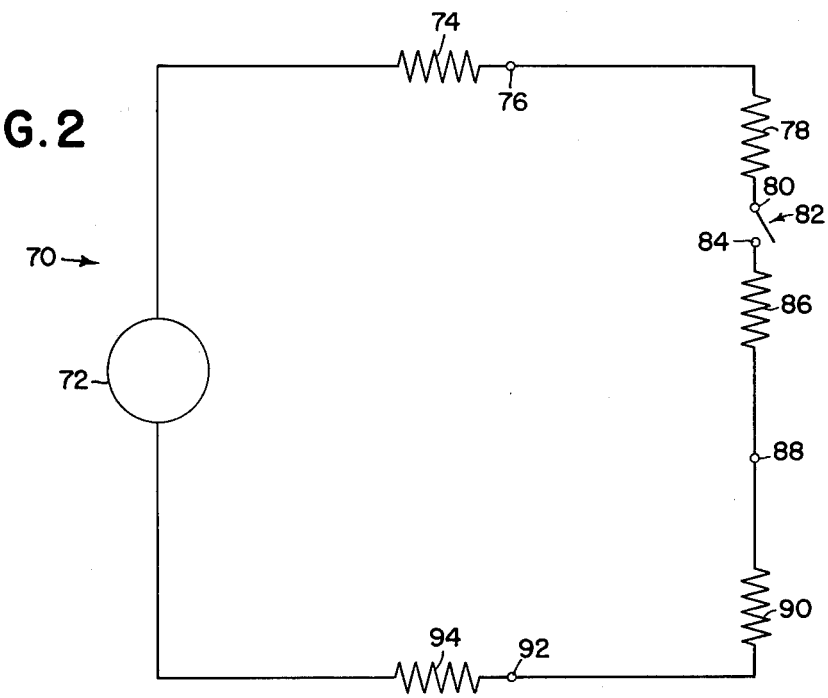
FIG. 2 is a schematic illustration of a typical single source electrical system.

Referring now to FIG. 2, therein is shown a simplified electrical schematic of a typical single source electrical system 70 having a single source of potential 72. The source 72 is connected by an internal source impedance 74 to a terminal 76. The terminal 76 is connected by a line impedance 78 to a test point 80. A switch 82 selectively interconnects the test point 80 with a test point 84. The test point 84 is connnected by a load impedance 86 to a test point 88. The test point 88 is connected by a line impedance 90 to a terminal 92 which is connected to the source 72 by an internal source impedance 94.

Figure 3:
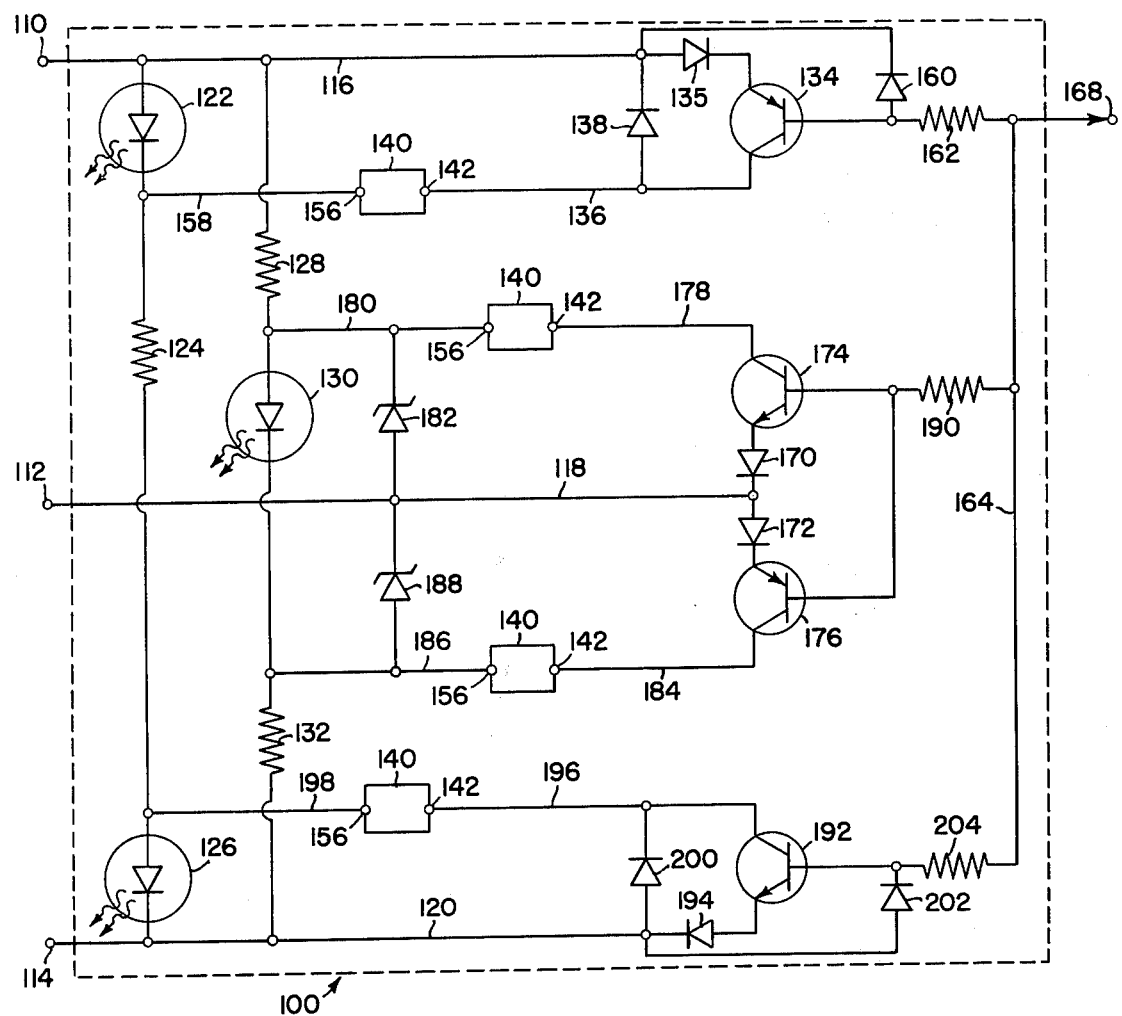
FIG. 3 is a schematic illustration of fixed potential continuity indicating circuitry in the present invention.

Referring now to FIG. 3, therein is shown fixed potential-continuity indicating circuitry 100 for diagnosing the system condition of dual or single source systems such as 10 and 70. The indicating circuitry 100 includes high, intermediate, and low potential terminal connectors 110, 112 and 114 which are respectively connected to basic leads 116, 118, and 120.

The basic lead 116 is connected to a conventional light-emitting diode 122 which is connected by a resistor 124 to a conventional light-emitting diode 126 which in turn is connected to the basic lead 120. The basic lead 116 is further connected by a resistor 128 to a conventional light-emitting diode 130 which is further connected by a resistor 132 to the basic lead 120.

The basic lead 116 is also connected by a diode 135 to the emitter of a PNP transistor 134. The collector of the transistor 134 is connected to a lead 136 which is connected by a diode 138 to the basic lead 116. The lead 136 is also connected to indication extender circuitry 140 at its input connection 142.

Figure 4:
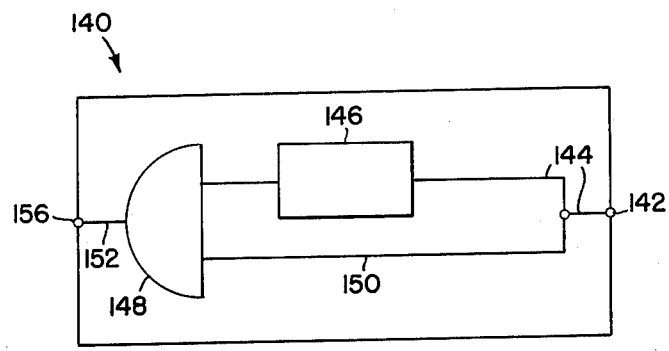
FIG. 4 is a schematic illustration of indication extender circuitry in the present invention.

Referring now to FIG. 4 for a more complete description of typical indication extender circuitry 140, therein is shown a lead 144 connected to the input connection 142. The lead 144 is connected to the input of a conventional monostable multivibrator 146. The output of the monostable multivibrator 146 is connected to one of the inputs of a conventional AND gate 148. A Lead 150 connects the lead 144 to a second input of the AND gate 148. The output of the AND gate is connected by a lead 152 to an output connection 156.

Referring back to FIG. 3, the output connection 156 is connected by a lead 158 to between the light-emitting diode 122 and the resistor 124. The base of the transistor 134 is connected by a diode 160 to the basic lead 116 and by a resistor 162 to a probe lead 164 and thence to a probe 168.

The basic lead 118 is connected by diodes 170 and 172 to the emitters of a NPN transistor 174 and a PNP transistor 176, respectively. The collector of the transistor 174 is connected by a lead 178 to extender circuitry 140 and therefrom by a lead 180 to between the resistor 128 and light-emitting diode 130. The lead 180 is further connected by a zener diode 182 to the basic lead 118. The collector of the transistor 176 is connected by a lead 184 to extender circuitry 140 and therefrom by a lead 186 to between the light-emitting diode 130 and the resistor 132. The lead 186 is further connected by a zener diode 188 to the basic lead 118. The bases of the transistors 174 and 176 are connected to the probe lead 164 by a resistor 190.

The basic lead 120 is connected by a diode 194 to the emitter of an NPN transistor 192. The collector of the transistor 192 is connected by a lead 196 to extender circuitry 140 and therefrom by a lead 198 to between the resistor 124 and light-emitting diode 126. A diode 200 connects the basic lead 120 to the lead 196. The base of the transistor 192 is connected by a diode 202 to the basic lead 120 and by a resistor 204 to the probe lead 164.

The operator procedure for using the circuitry 100 starts with the operator connecting the high, intermediate, and low potential connectors 110, 112, and 114 respectively to the terminals 18, 36, and 54 of the dual source electrical system 10.

When the connections of the circuitry 100 to the sources 12 and 14 are complete and while the probe 168 is isolated from the system 10, the basic leads 116, 118, and 120 will be subject to the terminal potentials and current will begin to flow therein. When the highest potential is on the connector 110, current will flow through the basic lead 116 to the transistor 134 so as to bias it on to allow the current to flow through the resistor 162 to the probe lead 164. The current in the probe lead 164 flows through the resistor 204 to bias on the transistor 192 and continue towards the lowest potential which would be at the basic lead 120.

Current will also flow from the basic lead 116 through the transistor 134 to the lead 136 and the extender circuitry 140 to the resistor 124. The current will bypass the light-emitting diode 122 so as to prevent it from lighting. The current through the resistor 124 will further flow through the lead 198, the extender circuitry 140, and the transistor 192 to the basic lead 120. The current will bypass the light-emitting diode 126 so as to prevent it from lighting.

Current will further flow from the basic lead 116 through the resistor 128, the zener diode 182, the basic lead 118, and the diode 172 to the transistor 176. The current flows through the transistor 176 so as to bias it on and allow current to flow from the base of the transistor 176 through the resistor 190 to the probe lead 164 as well as through extender circuitry 140 and the resistor 132 to the basic lead 120. The zener diodes 182 and 188 are selected such that the potential drop across either diode is insufficient to cause the light-emitting diode 130 to light while the combined potential drop is sufficient. This means that if either transistor 174 or 176 is biased on, the light-emitting diode 130 will be off. Thus, with the probe 168 isolated the current will bypass the light-emitting diode 130 so as to prevent it from lighting.

It should be noted that current flows in the components between the resistors 128, 132, and 190 are determined by the selection of the values of the resistors 162, 190, and 204. In the preferred embodiment, the resistors 162, 190, and 204 are selected such that the current flows therethrough impose a quiescent potential (the potential when the probe 168 is isolated) on the probe lead 164 and probe 168 which floats between the potentials on the basic leads 118 and 120. This prevents any of the light-emitting diodes from lighting when the probe 168 is isolated. An alternate selection of resistor values would allow the quiescent potential to float between the potentials on the basic leads 116 and 118.

Also, it should be noted that some negligible quantity of current will flow from the terminal 36 into the basic lead 118. This quantity depends upon the imbalance of potential values between the potential sources 12 and 14. Resistors 124, 128, and 132 are selected so as to minimize the effect of the imbalances as will be evident to those skilled in the art.

With the probe 168 isolated, the current flows will always be as described above even with alternating current because the diodes 138, 160, 200 and 202 in combination with the zener diodes 182 and 188 act as would be evident to those skilled in the art to provide protective bypass circuit paths around damageable components when a polarity reversal occurs or the various connectors are incorrectly connected to the various terminals. All the current will bypass through the various diodes and related resistors whenever the potentials at the terminals 18, 36 and 54 are not respectively, the high, the intermediate, and the low potentials.

In the situation where the function represented by the load impedance 28 fails to operate when the switch 24 is ostensibly closed, the system diagnosis begins with the operator placing the probe 168 in contact with a selected point or electrical connection on one side of the load impedance 28, for example the test point 26.

When there is an acceptable conductive path from the terminal 18 to the test point 26 as evidenced by a current flow through the line impedance 20 and the switch 24, the potential at the test point 26 will approach the potential at the terminal 18 and a minute current (approximately two milliamps) will flow into the probe 168 from the terminal 18 causing an increase in the probe potential from the quiescent potential. As the probe potential comes within a "fixed" potential relative to the terminal 18 potential, current will be prevented from flowing from the emitter to the base of the transistor 134 and the transistor 134 will be biased off forcing current flow from the basic lead 116 through the light-emitting diode 122 causing it to provide a digital, off-on, indication by lighting. As would be evident to those skilled in the art, the fixed potentials from which the fixed potential continuity indicating circuitry 100 derives its name is equal to the combined fixed potential drops of the potential drop across the base emitter junction of the transistors, the diode, and the resistance. Thus, the light-emitting diode 122 will provide a digital, off-on, indication by lighting whenever the probe potential is within the basic lead 116 potential minus the combined potential drops across the transistor 134, the diode 135 and the resistor 162. In the preferred embodiment, the combined potential drops or fixed potential ranges from 1- ½ to 2 volts. It would also be evident that the potential drop in each transistor alone would be sufficient to provide the total fixed potential in some applications and that the diode associated with each transistor may be dispensed with in those applications.

When there is an acceptable conductive path from the terminal 18 to the test point 26, the condition of the conductive path from the test point 26 to the terminal 36 is determined by opening the switch 24.

When there is no acceptable conductive path from the terminal 18 to the test point 26 as when the conductive path is open as represented by the switch 24 actually being open or the line impedance 20 is too great and imposes an excessive resistance but there is an acceptable conductive path between the terminal 36 and the test point 26 through the line impedance 32 and the load impedance 28, the potential at the test point 26 will approximate the potential at the terminal 36 and a minute current will flow into the probe 168 from the terminal 36 causing an increase in the probe potential from the quiescent potential. As the probe potential reaches a fixed potential relative to the terminal 36 potential, the transistor 176 will be biased off while maintaining transistor 174 off forcing current flow from the basic lead 116 through the light-emitting diode 130 causing it to provide a digital, off-on, indication by lighting. Thus, the light-emitting diode 130 will light whenever the probe potential equals the basic lead 118 potential minus the combined potential drops in the transistor 176 and across the diode 172. The light-emitting diode 130 will go out whenever the probe potential is greater than the basic lead 118 potential plus the combined fixed potential drops of the transistor 174 and diode 170 since the transistor 174 will then be biased on.

When neither of the conductive paths are acceptable, none of the light-emitting diodes will light. If the light-emitting diode 126 lights, a short circuit or incorrect connection is indicated because an incongruous potential is present. The circuit operation for lighting the light-emitting diode 126 will later be explained. Therefore, with one probing, both the high and intermediate potential conductive paths may be diagnosed as to acceptable continuity.

Next, when none of the light-emitting diodes lights, the operator moves the probe 168 to another test point further away from the load impedance 28 working along the unacceptable conductive path. If the conductive path between the test point 26 to the terminal 18 were unacceptable, the operator would place the probe 168 in contact with the test point 22. If the light-emitting diode 122 lights, the switch 24 is open and defective; if the light-emitting diode 122 does not light, the open must be between the test point 22 and the terminal 18. If the conductive path between the test point 26 and the terminal 36 were unacceptable, , the operator would place the probe 168 in contact with the test point 30. If the light emitting diode 130 lights, the load impedance 28 is defective; if the light-emitting diode 130 does not light, the open must be between the test point 30 and the terminal 36.

In the situation where the function represented by the load impedance 46 fails to operate when the switch 42 is ostensibly closed, the system diagnosis begins with the operator placing the probe 168 in contact with an electrical connection on one side of the load impedance 46, for example at the test point 44.

When there is an acceptable conductive path between the terminal 36 and the test point 44 as evidenced by current flow through the line impedance 38 and the switch 42, the potential at the test point 44 will approach the potential at the terminal 36 and a minute current will flow into the probe 168 from the terminal 36. As the probe potential reaches the fixed potential relative to the terminal 36 potential, current will be prevented from flowing at the bases of transistors 174 and 176 and both transistors 174 and 176 will be biased off forcing current flow from the basic lead 116 through the light-emitting diode 130 causing it to light.

When there is an acceptable conductive path from the terminal 36 to the test point 44, the condition of the conductive path from the test point 44 to the terminal 54 is determined by opening the switch 42.

When there is no acceptable conductive path from the terminal 36 to the test point 44 but there is an acceptable conductive path between the terminal 54 and the test point 44, the potential at the test point 44 will approach the potential at the terminal 54 and a minute current will flow from the probe 168 into the terminal 54 causing a decrease in the probe potential from the quiescent potential. As the probe potential reaches the fixed potential relative to the terminal 54 potential, the transistor 192 will be biased off forcing the current flow from the basic lead 116 which passes through the transistor 134 and the resistor 124 to flow through the light-emitting diode 126 causing it to light.

When neither of the conductive paths is acceptable, neither of the light-emitting diodes 130 or 126 will light. If the light-emitting diode 122 lights, a short circuit, an incorrect connection, or the lack of a connection to the terminal 36 is indicated because an incongruous potential is present. Therefore, with one probing, both the intermediate and low potential conductive paths may be diagnosed.

Next, when none of the light-emitting diodes lights, the operator moves the probe 168 to another test point further away from the load impedance 46 working along the unacceptable conductive path as explained above. The test point 40 should have a potential which approximates within the fixed potential the potential at the terminal 36 and the test point 48 should have a potential which approximates within the fixed potential the potential at the terminal 54. As would be evident to those skilled in the art, testing at test points 62 and 66 will be similar to testing at test points 26 and 22, respectively, and testing at test point 58 will be similar to testing at test point 48.

In the situation where the potential sources 12 and 14 are providing pulse outputs of too short a duration to be seen or to activate the light-emitting diodes or there is intermittent conductivity due to a loose connection, each of the light-emitting diodes can be held on by its associated indication extender circuitry 140 as will hereinafter be explained.

While the probe potential is away from any of the fixed potentials wherein an indication is provided, the monostable multivibrator 146 will be conductive causing two inputs to the AND gate 148. A momentary excursion into one of the fixed potentials will cause an instantaneous decrease in the current to the monostable multivibrator 146 rendering it nonconductive for a predetermined extended duration regardless of the subsequent immediate increase in the current. With one input blocked, the AND gate 148 will be nonconductive preventing current flow through the lead 150 until the monostable multivibrator 146 returns to its conductive state. Thus, a pulse output or intermittent conductivity will hold the related light-emitting diode on for at least a minimum duration.

Figure 5:
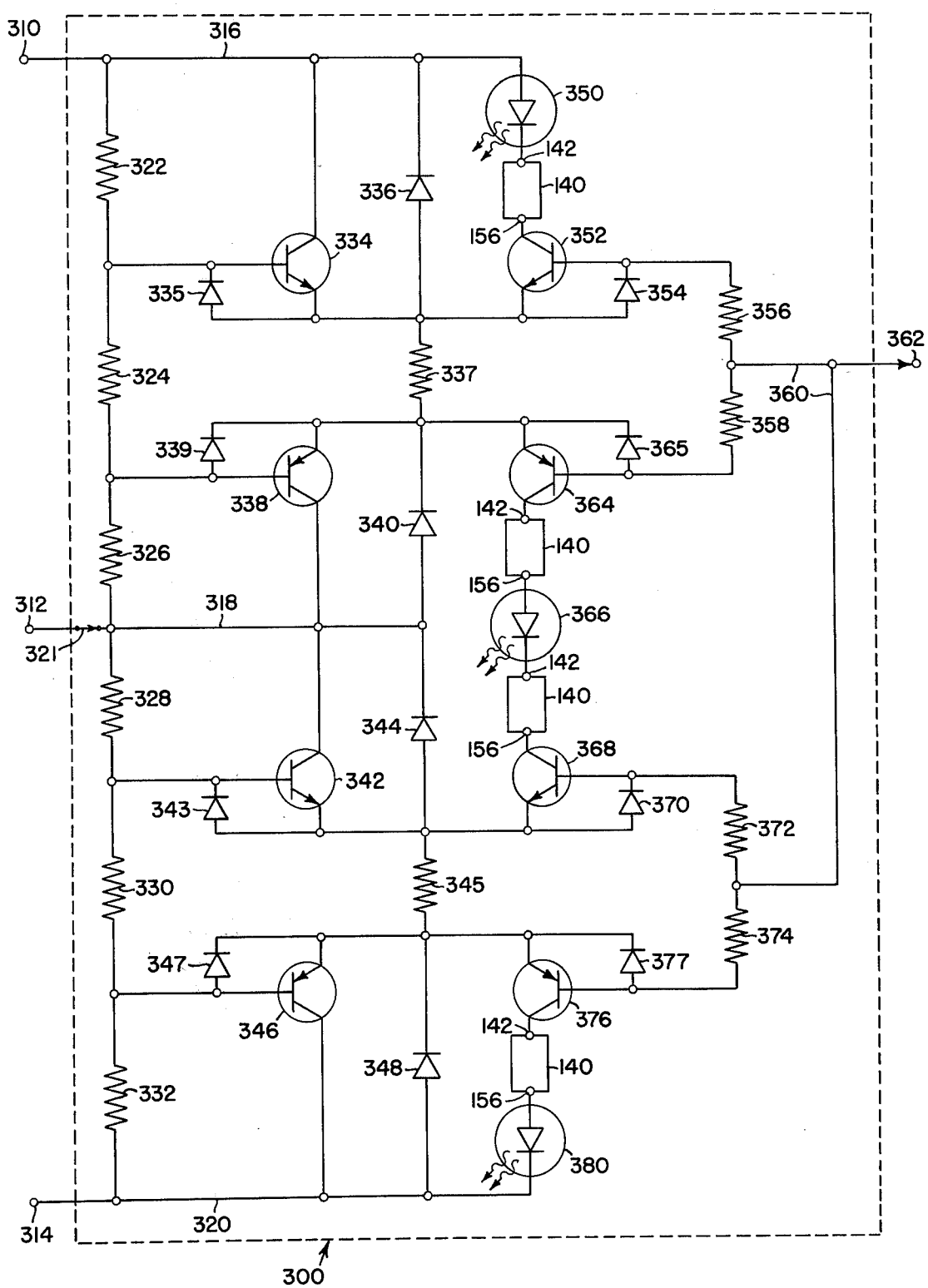
FIG. 5 is a schematic illustration of percentage potential continuity indicating circuitry in the present invention.

Referring now to FIG. 5, therein is shown percentage potential-continuity indicating circuitry 300. The indicating circuitry 300 includes high, intermediate, and low potential terminal connectors 310, 312 and 314 connected respectively to basic leads 316, 318, and 320. The basic lead 316 is connected by resistors 322, 324, and 326 to the basic lead 318 and the basic lead 318 is connected in turn by resistors 328, 330, and 332 to the basic lead 320. A normally closed switch 321 is interposed in the basic lead 318 for selectively normally allowing and blocking current flow to and from the connector 312.

The basic lead 316 is connected to the collector of an NPN transistor 334. The base of the transistor 334 is connected between the resistor 322 and 324, and the emitter is connected to the base by a diode 335, to the basic lead 316 by a diode 336, and to a resistor 337. The resistor 337 is connected to the emitter of a PNP transistor 338, to the base of the transistor 338 by a diode 339, and to the basic lead 318 by a diode 340. The base of the transistor 338 is connected between the resistors 324 amd 326, and the collector is connected to the basic lead 318. The basic lead 318 is further connected to the collector of an NPN transistor 342. The base of the transistor 342 is connected between the resistors 328 and 330, and the emitter is connected to the base by a diode 343, to the basic lead 318 by a diode 344, and to a resistor 345. The resistor 345 is connected to the emitter of a PNP transistor 346, to the base by a diode 347, and to the basic lead 320 by a diode 348. The base of the transistor 346 is connected between the resistors 330 and 332, and the collector is connected to the basic lead 320.

The basic lead 316 is further connected to a conventional light-emitting diode 350 which is connected by extender circuitry 140 to the collector of an NPN transistor 352. The emitter of the transistor 352 is connected to its base by a diode 354 and to between the emitter of the transistor 334 and the resistor 337, and the base is connected to a resistor 356. The resistor 356 is connected to a resistor 358 and to a probe lead 360 which in turn is connected to a probe 362. The resistor 358 is connected to the base of a PNP transistor 364. The emitter of the transistor 364 is connected to its base by a diode 365 and to between the resistor 337 and the emitter of the transistor 338, and the collector is connected through extender circuitry 140 to a light-emitting diode 366. The light-emitting diode 366 is connected through extender circuitry 140 to the collector of an NPN transistor 368. The emitter of the transistor 368 is connected to its base by a diode 370 and to between the resistor 345 and the emitter of the transistor 342, and the base is connected to a resistor 372. The resistor 372 in turn is connected to a resistor 374 and to the probe lead 360. The resistor 374 is connected to the base of a PNP transistor 376. The emitter of the transistor 376 is connected to its base by a diode 377 and to between the resistor 345 and the emitter of the transistor 346, and the collector is connected through extender circuitry 140 to a light-emitting diode 380 and thence to the basic lead 320.

The operator procedure for using the indicating circuitry 300 consists of connecting the terminal connectors 310, 312, and 314 respectively to the terminals 18, 36, and 54 of the dual source electrical system 10.

When the connections to the terminals 18, 36, and 54 are complete and while the probe 362 is isolated, the basic leads 316, 318, and 320 will be subject to the terminal potentials and current will begin to flow therein. When the highest potential is on the basic lead 316, current will flow therefrom through the resistors 322, 324, 326, 328, 330, and 332, to the basic lead 320. The potential between the resistors 322 and 324 due to the current flow therethrough will bias the transistor 334 on allowing current flow from the basic lead 316 therethrough to the resistor 337 and also through the diode 354 and resistor 356 to the probe lead 360. Since the potentials at the emitter and base of the transistor 352 will be reverse biased due to the conductive condition of the diode 354, the transistor 352 will be biased off preventing current flow through the lighting of the light-emitting diode 350. The potential between the resistors 324 and 326 due to the current therethrough will bias the transistor 338 on allowing current flow therethrough from resistor 337 toward the transistor 342. The potential between the resistors 328 and 330 due to the current flow therethrough will bias the transistor 342 on allowing current therethrough from the transistor 338 into the resistor 345 and also through the diode 370 and the resistor 372 to the probe lead 360. Since the potentials at the emitter and base of the transistor 368 will be reverse biased due to the conductive condition of the diode 370, the transistor 368 will be biased of preventing current flow through the light-emitting diode 366 which, although the transistor 364 is on, prevents the lighting of the light-emitting diode 366. The potential between the resistors 330 and 332 due to the current flow therethrough will bias the transistor 346 on allowing current flow therethrough to the basic lead 320 from the resistor 345 and also from the probe lead 360 through the resistor 374 and the diode 377. Since the potentials at the emitter and base of the transistor 376 will be equal due to the conductive condition of the diode 377, the transistor 376 will be biased off preventing current flow through and lighting of the light-emitting diode 380.

It should be noted that current flows in the components proximate the basic lead 318 are determined by the selection of the resistors 356, 358, 372, and 374. In the preferred embodiment, these resistors are selected such that the current flows therethrough impose a quiescent potential (the potential when the probe 362 is isolated) on the probe lead 360 which floats between the potentials on the basic leads 318 and 320 so as to prevent any of the light-emitting diodes from lighting when the probe 362 is isolated. An alternate selection of resistors and diode values would allow the quiescent potential to float between the potentials on the basic leads 316 and 318.

Some negligible quantity of current will flow from the terminal 36 into the basic lead 318 depending upon the imbalance of potential values between the potential sources 12 and 14. Resistors 322, 324, 326, 328, 330, 332, 337 and 345 are selected so as to minimize the effect of these imbalances.

With the probe 362 isolated, the current flow will always be as described above even with alternating current because the diodes 335, 336, 339, 340, 343, 344, 347, and 348 act to provide protective bypass circuit paths around damageable components when a polarity reversal occurs or the various connectors are incorrectly connected to the various terminals. All the current flow will bypass through the various diodes and related resistors whenever the potentials at the terminals 18, 36, and 54 are not respectively the high, intermediate, and low potentials.

In the situation where the function represented by the load impedance 28 fails to operate when the switch 24 is ostensibly closed, the system diagnosis begins with the operator placing the probe 356 in contact with a selected point or electrical connection on one side of the load impedance 28, for example the test point 26.

When there is an acceptable conductive path from the terminal 18 to the test point 26 as evidenced by a current flow through the line impedance 20 and the switch 24, the potential at the test point 26 will approximate the potential at the terminal 18 and a minute current (approximately two milliamps) will flow into the probe 362 from the terminal 18 causing an increase in the probe potential from the quiescent potential. As the probe potential comes within a predetermined "percentage" of the basic lead 316 potential, the potential at the base of the transistor 352 increases until the diode 354 stops conducting and current flows into the transistor 352 biasing it on. When the potential at the base of transistor 352 exceeds the potential at the base of transistor 334, all the current flows through the transistor 352 to the resistor 337 causing an increase of potential at the emitter of transistor 334 which biases it off. When the transistor 334 is biased off, the current flow from the basic lead 316 will be forced through the light-emitting diode 350 causing it to light. As would be evident to those skilled in the art, the percentage from which the percentage potential-continuity indicating circuitry 300 derives its name is determined by the values of the resistors 322, 324, 326, 328, and 332 which establish the potentials at which the transistors 334, 338, 342, and 346 are biased off as a function of the basic lead potentials. The resistors provide potential drops which divide the potential between each of the basic leads. Thus, the light-emitting diode 350 will light whenever the probe potential minus the potential drop across the resistor 356 equals the potential between the resistors 322 and 324 which is a predetermined percentage of the potential at the basic lead 316. In this embodiment, the predetermined percentages at which a light-emitting diode will turn on is a probe potential which is within 10 to 20 percent of the basic lead potentials.

When there is an acceptable conductive path from the terminal 18 to the test point 26, the condition of the conductive path from the test point 26 to the terminal 36 is determined by opening the switch 24.

When there is no acceptable conductive path from the terminal 18 to the test point 26 as when the conductive path is open as represented by the switch 24 actually being open or the line impedance 20 is too great and imposes an excessive resistance but there is an acceptable conductive path between the terminal 36 and the test point 26, through the line impedance 32 and the load impedance 28, the potential at the test point 26 will approach the potential at the terminal 36 and a minute current will flow into the probe 362 from the terminal 36 causing an increase in the probe potential from the quiescent potential.

As the probe potential enters the range bordered by the basic lead 318 potential minus the predetermined percentage, the diode 370 will be rendered nonconductive causing the transistor 368 to be biased on. As the transistor 368 allows current flow therethrough, the transistor 364 is biased on allowing full current flow therethrough to light the light-emitting diode 366 and bias off the transistors 338 and 342. The light-emitting diode 366 will remain on unless the probe potential exceeds the basic lead 318 potential plus the predetermined percentage. At this point, the potential at the base of the transistor 364 will exceed the potential at the base of the transistor 338 rendering the diode 365 conductive. With diode 365 conductive, the transistor 364 will be biased off causing the transistors 338 and 342 to be biased on and the transistor 368 to be biased off blocking current flow through the light-emitting diode 366. Thus, the light-emitting diode 366 will light whenever the probe potential is within a predetermined percentage of the basic lead 318 potential and will go out whenever the probe potential is greater or less than the predetermined percentage of the basic lead 318 potential.

When neither of the conductive paths are acceptable, none of the light-emitting diodes will light. If the light-emitting diode 380 lights, a short circuit or incorrect connection is indicated because an incongruous potential is present. The circuit operation for lighting the light-emitting diode 380 will later be explained. Therefore, with one probing, both the high and intermediate potential conductive paths may be diagnosed.

Next, when none of the light-emitting diodes lights, the operator moves the probe 362 to another test point further away from the load impedance 28 working along the unacceptable conductive path. If the conductive path between the test point 26 and the terminal 18 were unacceptable, the operator would place the probe 362 in contact with the test point 22. If the light-emitting diode 350 lights, the switch 24 is open and defective; if the light-emitting diode 350 does not light, the open must be between the test point 22 and the terminal 18. If the conductive path between the test point 26 and the terminal 36 were unacceptable, the operator would place the probe 362 in contact with the test point 30. If the light-emitting diode 366 lights, the load impedance 28 is defective; if the light-emitting diode 366 does not light, the open must be between the test point 30 and the terminal 36.

In the situation where the function represented by the load impedance 46 fails to operate when the switch 42 is ostensibly closed, the system diagnosis begins with the operator placing the probe 362 in contact with an electrical connection on one side of the load impedance 46, for example at the test point 44.

When there is an acceptable conductive path between the terminal 36 and the test point 44 as evidenced by current flow through the line impedance 38 and the switch 42, the potential at the test point 44 will approach the potential at the terminal 36 and a minute current will flow into the probe 362 from the terminal 36. As the probe potential reaches the predetermined percentage of the terminal 36 potential, the circuitry 300 operation will duplicate the test point 30 operation such that the transistors 364 and 368 will be biased on and current will be forced to flow through the light-emitting diode 366 turning it on. Thus, the light-emitting diode 366 will light whenever the probe potential minus the potential drop across the resistor 372 equals the potential between the resistors 328 and 330 which is a predetermined percentage less than the potential at the basic lead 318.

When there is an acceptable conductive path from the terminal 36 to the test point 44, the condition of the conductive path from the test point 44 to the terminal 54 is determined by opening the switch 42.

When there is no acceptable conductive path from the terminal 36 to the test point 44 but there is an acceptable conductive path between the terminal 54 and the test point 44, the potential at the test point 44 will approach the potential at the terminal 54 and a minute current will flow from the probe 362 into the terminal 54 causing a decrease in the probe potential from the quiescent potential. As the probe potential comes within the predetermined percentage of the basic lead 320 potential, the potential at the base of the transistor 376 increases until the diode 377 stops conducting and current flows into the transistor 376 biasing it on. When the potential at the base of the transistor 376 exceeds the potential at the base of the transistor 346, the current flows through the transistor 376 to the basic lead 320 and also through the resistor 374 to the probe 362 causing an increase of the potential at the emitter of the transistor 346 which biases it off. When the transistor 346 is biased off, current flow from the resistor 345 will be forced through the light-emitting diode 380 causing it to light. Thus, the light-emitting diode 380 will light whenever the probe potential minus the potential drop across the resistor 374 equals the potential between the resistors 330 and 332 which is a predetermined percentage of the potential at the basic lead 320.

When neither of the conductive paths is acceptable, neither of the light-emitting diodes 366 or 380 will light. If the lightemitting diode 350 lights, a short circuit, an incorrect connection or a lack of connection to the terminal 36 is indicated because an incongruous potential is present. Therefore, with one probing, both the intermediate and low potential conductive paths may be diagnosed.

Next, when one of the light-emitting diodes lights, the operator moves the probe 362 to another test point further away from the load impedance 46 working along the unacceptable conductive path as explained above. The test point 40 should have a potential which approximates within the predetermined percentage the potential at the terminal 36 and the test point 48 should have a potential which approximates within the predetermined percentage the potential at the terminal 54.

As would be evident to those skilled in the art, testing at test point 62 and 66 would be similar to testing at test point 26 and 22, and testing at test point 58 similar to testing at test point 48.

Figure 6:
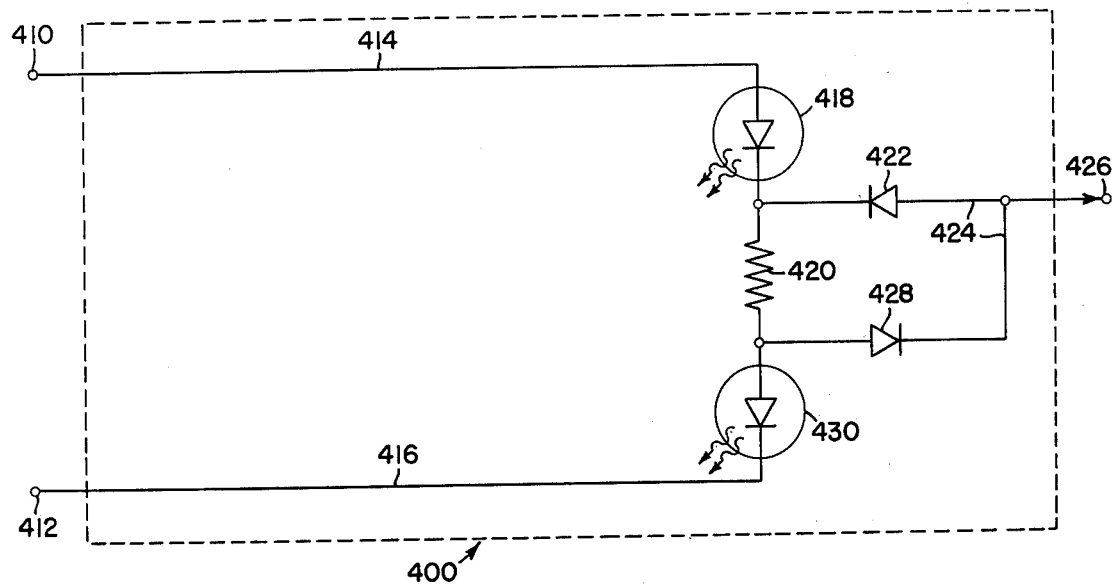
FIG. 6 is a schematic illustration of simplified fixed potential continuity indicating circuitry in the present invention.

Referring now to FIG. 6, therein is shown simplified fixed potential-continuity circuitry 400 for diagnosing the system condition of single source systems such as 70. As would be evident to those skilled in the art, the fixed potential-continuity circuitry 100 and the percentage potential-continuity circuitry 300 can be used to test single source systems such as 70 by connecting the intermediate potential connectors 112 and 312 to one of the other terminals and opening the switch 321 or by deleting the components operatively associated with the basic leads 118 and 318. However, the simplified indicating circuitry 400 is the best suited for single source applications, for example for 12 volt automotive systems, although it may be used to test dual source systems such as 10 by various connector and terminal changes.

The simplified indicating circuitry 400 includes high and low terminal connectors 410 and 412 connected respectively to basic leads 414 and 416. The basic lead 414 is connected to a lightemitting diode 418 which is connected to a resistor 420 and by a diode 422 to a probe lead 424 and thence to a probe 426. The resistor 420 is connected by a diode 428 to the probe lead 424 and to a light-emitting diode 430 which is connected to the basic lead 416.

The operator procedure for using the indicating circuitry 400 consists of connecting the terminal connectors 410 and 412 respectively to the terminals 76 and 92 of the single-source electrical system 70.

When the connections to the terminals 76 and 92 are complete and while the probe 426 is isolated, the basic leads 414 and 416 will be subject to the terminal potentials and current will begin to flow therein. When the higher potential is on the basic lead 414, current will flow therefrom through the light-emitting diode 418, the resistor 420, and the light-emitting diode 430 to the basic lead 416. Therefore, with the probe 426 isolated, the light-emitting diodes 418 and 430 will be on. The light-emitting diodes 418 and 430 further are selected to provide reverse polarity protection to accommodate alternating current operation by blocking reverse current flow and similarly prevent operation when the connectors are incorrectly connected to the terminals.

In the situation where the function represented by the load impedance 86 fails to operate when the switch 82 is ostensibly closed, the system diagnosis begins with the operator placing the probe 426 in contact with a selected point or electrical connection on one side of the load impedance 86, for example the test point 84.

When there is an acceptable conductive path from the terminal 76 to the test point 84 as evidenced by a current flow through the line impedance 78 and the switch 82, the potential at the test point 84 will approach the potential at the terminal 76 and a minute current (approximately 30 milliamps) will flow into the probe 426 from the terminal 76 causing the probe 426 potential to approach the basic lead 414 potential. As the probe potential reaches a fixed potential relative to the terminal 76 potential, current will be prevented from flowing from the basic lead 414 through the light-emitting diode 418 causing it to turn off. As would be evident to those skilled in the art, the fixed potentials from which the simplified fixed potential-continuity indicating circuitry 400 derives its name is equal to the combined fixed potential drops of the potential drop of the light-emitting diode and the diode associated with it. Thus, the lightemitting diode 418 will go out whenever the probe potential equals the basic lead 414 potential minus the potential drop across the light-emitting diode 418 and the diode 428.

When there is an acceptable conductive path from the terminal 76 to the test point 84, the condition of the conductive path from the test point 84 to the terminal 92 is determined by opening the switch 82.

When there is no acceptable conductive path from the terminal 76 to the test point 84 as when the conductive path is open as represented by the switch 82 actually being open or the line impedance 78 is too great and imposes an excessive resistance but there is an acceptable conductive path between the terminal 92 and the test point 84 through the line impedance 90 and the load impedance 86, the potential at the test point 84 will approximate the potential at the terminal 92 and a minute current will flow out of the probe 426 to the terminal 92 causing the probe potential to decrease to the basic lead 416 potential. As the probe potential reaches a fixed potential relative to the terminal 92 potential, the current will flow through the diode 428 so as to bypass the light-emitting diode 430 causing it to turn off. Thus, the light-emitting diode 430 will turn off whenever the probe potential equals the basic lead 416 potential plus the potential drop across the light-emitting diode 430 and the diode 422.

When neither of the conductive paths are acceptable, both of the light-emitting diodes will light. Therefore, with one probing, both the high and low potential conductive paths may be diagnosed.

Next, when both of the light-emitting diodes light, the operator moves the probe 426 to another test point further away from the load impedance 86 working along the unacceptable conductive path. If the conductive path between the test point 84 and the terminal 76 were unacceptable, the operator would place the probe 426 in contact with the test point 80. If the light-emitting diode 418 goes out, the switch 82 is open and defective; if the light-emitting diode 418 remains on, the open must be between the test point 80 and the terminal 76. If the conductive path between the test point 84 and the terminal 92 were unacceptable, the operator will place the probe 426 in contact with the test point 88. If the light-emitting diode 430 goes out, the load impedance 86 is defective; if the light-emitting diode 430 remains on, the open must be between the test point 88 and the terminal 92.

Figure 7:
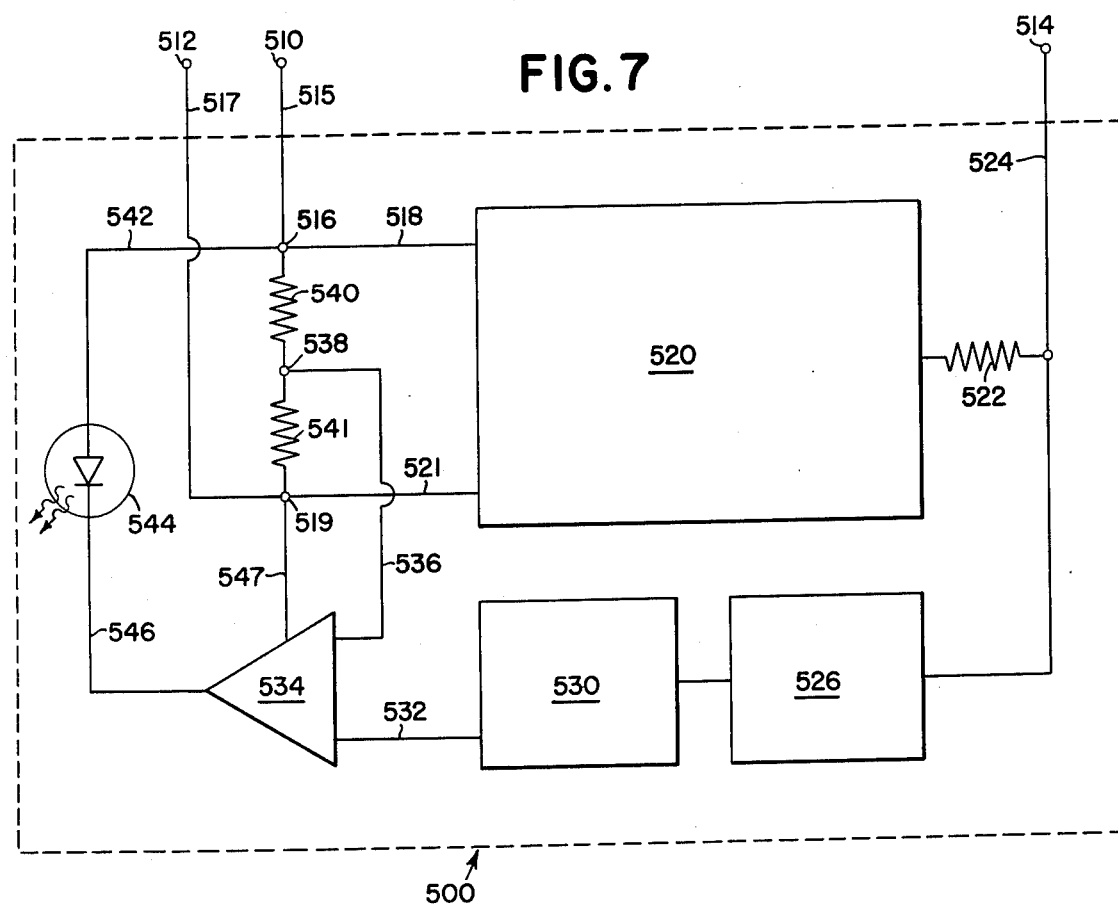
FIG. 7 is a schematic illustration of continuity indicating circuitry in the present invention.

Referring now to FIG. 7, therein is shown impedance-continuity indicating circuitry 500 providing the capability of distinguishing between an open circuit and an excessive resistance. The indicating circuitry 500 includes high and low potential base lead connectors 510 and 512 and a probe lead connector 514. The connector 510 is connected by a lead 515 to a main junction 516 and the connector 512 is connected by a lead 517 to a junction 519. The junction 516 is connected by a lead 518 to a conventional oscillator 520 for producing a square wave oscillating current signal. The oscillator 520 is connected by a lead 521 to the junction 519 and by a resistor 522 to a probe lead 524. The probe lead 524 is connected to the probe lead connection 514 and to a conventional high pass filter 526. The high pass filter 526 is connected in series to a conventional rectifier 530. The rectifier 530 is connected in turn by a lead 532 to the first input of a conventional comparator circuit 534. The second input of the comparator 534 is connected by a lead 536 to a junction 538. The junction 538 is connected by a resistor 540 to the junction 516 and by a resistor 541 to the junction 519. The junction 516 is further connected by a lead 542 to a conventional light-emitting diode 544. The light-emitting diode 544 is connected in turn by a lead 546 to the output of the comparator 534. The comparator 534 is further connected by a lead 547 to the junction 519. It should be noted that while the lead 546 is connected to the output of the comparator 534 insofar as the circuit logic is concerned, current actually flows through the lead 546 into the comparator 534 and therefrom to the connector 512 through the lead 547 when the light-emitting diode 544 is on.

In operation, the potentials on leads 515 and 517 are taken by the oscillator 520 and converted into a square wave oscillating current signal which is imposed on the line 524. The square wave signal in the probe lead 524 passes into the high pass filter 526 which removes the direct current component of the signal. The square wave signal then passes to the rectifier 530 which produces a direct current output directly proportional to the magnitude of the square wave oscillation current. The direct current signal is then compared in a comparator 534 with a reference signal produced in the potential divider formed by the resistors 540 and 541. The resistors 540 and 541 are selected to establish a maximum impedance for continuity; an impedance above the maximum will be considered to be an open circuit. As long as the potential from the rectifier 530 is greater than the potential at the junction 538, the comparator 534 will prevent current from flowing from the connector 510 through the light-emitting diode 544.

When an impedance is operatively connected to the probe lead 524, the square wave of the oscillating current is attenuated and the potential which results through the high pass filter 526 and the rectifier 530 is reduced so as to be below the reference potential at the junction 538 as determined by the resistors 540 and 541. The comparator 534 will then allow current flow therethrough from the lead 515, through the lead 542, the light-emitting diode 544, lead 546, the junction 519, and to the lead 517. /Thus the light-emitting diode 544 will light whenever an impedance up to the maximum is placed on the probe lead 524.

Referring now to FIG. 8, therein is shown the preferred embodiment of the fault detector generally designated by the numeral 600. The fault detector 600 includes the fixed potential-continuity indicating circuitry 100 and the impedance continuity indicating circuitry 500 connected thereto. The connector 510 is connected to the lead 116, the connector 512 is connected to the basic lead 120, and the connector 514 is connected to the probe lead 164.

Referring now to FIG. 9, therein is shown the first alternate embodiment of the fault detector generally designated by the numeral 700. The fault detector 700 includes the percentage potential-continuity indicating circuitry 300 connected with the impedance continuity indicating circuitry 500. The connector 510 is connected to the basic lead 316, the connector 512 is connected to the basic lead 320, and the connector 514 is connected to the probe lead 360.

Referring now to FIG. 10, therein is shown a second alternate embodiment of the fault detector generally designated by the numeral 800. The fault detector 800 includes the simplified fixed potential-continuity indicating circuitry 400 connected with the impedance continuity indicating circuitry 500. The connector 510 is connected to the basic lead 414, the connector 512 is connected to the basic lead 416, and the connector 514 is connected to the probe lead 424.

While the invention has been described in conjunction with specific embodiments, it is to be understood that many alternatives, modifications, and variations will be apparent to those skilled in the art in light of the foregoing description. Accordingly, it is intended to embrace all such alternatives, modifications, and variations which fall within the spirit and scope of the appended claims.

I claim:

1. A detector for determining continuity in an electrical circuit between a selected point in the circuit and an electrical source in the circuit, said source having first and second source potentials, comprising: probe means adapted to be placed in contact with the selected point; first and second connector means adapted to be connected respectively to the first and second source potentials; first indicator means connected to the probe and first connector means responsive to the potentials thereat to provide a first digital, off-on indication when the potentials are approximately equal thereby indicating continuity in the circuit between the point and first source potential; and second indicator means connected to the probe and second connector means responsive to the potentials thereat to provide a second digital, off-on indication when the potentials are approximately equal thereby indicating continuity in the circuit between the point and second source potential.

2. The detector as claimed in claim 1 wherein the first and second indicator means includes first and second protective means for protecting the first and second indicator means from damage when the first connector means is connected to the second source potential and the second connector means is connected to the first source potential.

3. The detector as claimed in claim 1 including means for maintaining the first digital indication when the probe and first connector means potentials are intermittently approximately equal and maintaining the second digital indication when the probe and second connector means potentials are intermittently approximately equal.

4. The detector as claimed in claim 1 including means for applying an oscillating signal to the probe means; and means responsive to a predetermined attenuation of the signal for providing an indication thereof.

5. A detector for determining continuity in an electrical circuit between a selected point in the circuit and a source in the circuit, said source having first, second, and third source potentials, comprising: probe means adapted to be placed in contact with the selected point; first, second, and third connector means adapted to be connected to the first, second and third source potentials; first indicator means connected to the probe and first connector means responsive to the potentials thereat to provide a first indication when the potentials are approximately equal thereby indicating continuity in the circuit between the point and the first source potential; second indicator means connected to the probe and second connector means responsive to the potentials thereat to provide a second indication when the potentials are approximately equal thereby indicating continuity in the circuit between the point and the second source potential; third indicator means connected to the probe and third connector means responsive to the potentials thereat to provide a third indication when the potentials are approximately equal thereby indicating continuity in the circuit between the point and third source potential.

6. The detector as claimed in claim 5 wherein the first, second, and third indicator means includes first, second, and third protective means for protecting the first, second, and third indicator means from damage when the first connector means is connected to the second or third source potential, the second connector means is connected to the first or third source potential, or the third connector means is connected to the first or second source potential.

7. The detector as claimed in claim 5 including means for maintaining the first indication when the probe means and first connector means potentials are intermittently approximately equal, the second indication when the probe means and second connector means potentials are intermittently approximately equal, and the third indication when the probe means and third connector means potentials are intermittently approximately equal.

8. The detector as claimed in claim 5 including means for floating the quiescent potential of the probe means at a potential between the potential at the first and second connector means potentials.

9. The detector as claimed in claim 5 including means for floating the quiescent potential of the probe means at a potential between the potential of the second and third connector means.

10. The detector as claimed in claim 5 including means for applying an oscillating signal to the probe means; and means responsive to a predetermined attenuation of the signal for providing an indication thereof.

11. The detector as claimed in claim 5 wherein the second indicator means includes means for preventing operation of the second indicator means when the second connector means is connected to the first or second source potential.

12. A detector for determining continuity in an electrical circuit between a selected point in the circuit and a source in the circuit, said source having first and second source potentials, comprising: probe means adapted to be placed in contact with the selected point; first and second connector means adapted to be connected respectively to the first and second source potentials; first indicator means connected to the probe and first connector means responsive to the potentials thereat to provide a first digital, off-on indication when the potentials are within a first predetermined fixed range of each other thereby indicating acceptable continuity in the circuit between the point and the first source potential; and second indicator means connected to the probe and second connector means responsive to the potentials thereat to provide a second digital, off-on indication when the potentials are within a second predetermined fixed range of each other thereby indicating acceptable continuity between the point and the second source potential.

13. The detector as claimed in claim 12 wherein the first and second indicator means include first and second protective means for protecting the first and second indicator means from damage when the first connector means is connected to the second source potential and the second connector means is connected to the first source potential or when the source potentials undergo polarity reversals.

14. The detector as claimed in claim 12 including means for maintaining the first or second digital indications when the potential at the probe means is intermittently within the first or second predetermined fixed range.

15. The detector as claimed in claim 12 including means for applying an oscillating signal to the probe means; and means responsive to a predetermined attenuation of the signal for providing an indication thereof.

16. A detector for determining continuity in an electrical circuit between a selected point in the circuit and a source in the circuit, said source having first, second, and third source potentials, comprising: probe means adapted to be placed in contact with the selected point; first, second, and third connector means adapted to be connected respectively to the first, second, and third source potentials; first indicator means connected to probe and first connector means responsive to the potentials thereat to provide a first indication when the potentials are within a first predetermined fixed range of each other thereby indicating acceptable continuity in the circuit between the point and the first source potential; second indicator means connected to the probe and second connector means responsive to the potentials thereat to provide a second indication when the potentials are within a second predetermined fixed range of each other thereby indicating acceptable continuity in the circuit between the point and the second source potential; third indicator means connected to the probe and third connector means responsive to the potentials thereat to provide a third indication when the potentials are within a third predetermined fixed range of each other thereby indicating acceptable continuity in the circuit between the point and third source potential.

17. The detector as claimed in claim 16 wherein the first, second, and third indicator means includes first, second, and third protective means for protecting the first, second, and third indicator means from damage when the first connector means is connected to the second or third source potential, or the second connector means is connected to the first or third source potential, or the third connector means is connected to the first or second source potential or when the source potentials undergo polarity reversals.

18. The detector as claimed in claim 16 wherein the first, second, and third indicator means includes first, second, and third extender means for maintaining the first, second, or third indications when the probe means potential is intermittently within the first, second, or third predetermined fixed range.

19. The detector as claimed in claim 16 including means for floating the quiescent potential of the probe means at a potential between the first and second predetermined fixed ranges.

20. The detector as claimed in claim 16 including means for floating the quiescent potential of the probe means at a potential between the second and third predetermined fixed ranges.

21. The detector as claimed in claim 16 including means connected to the first and third connector means and the probe means for applying an oscillating signal to the probe means; and means connected to the probe means responsive to a predetermined attenuation of the signal for providing an indication thereof thereby indicating continuity between the point and one of the source potentials.

22. A detector for determining continuity in an electrical circuit between a selected point in the circuit and a source in the circuit, said source having first and second source potentials, comprising: probe means adapted to be placed in contact with the selected point; first and second connector means adapted to be connected respectively to the first and second source potentials; first indicator means connected to the probe and first connector means responsive to the potentials thereat to provide a first digital, off-on indication when the potential at the probe means is a first predetermined percentage of the potential at the first connector means thereby indicating acceptable continuity in the circuit between the point and the first source potential; second indicator means connected to the probe and second connector means responsive to the potentials thereat to provide a second digital, off-on indication when the potential at the probe means is a second predetermined percentage of the potential at the second connector means thereby indicating acceptable continuity between the point and the second source potential.

23. The detector as claimed in claim 2 wherein the first and second indicator means includes first and second protective means for protecting the first and second indicator means from damage when the first connector means is connected to the second source potential and the second connector means is connected to the first source potential or when the source potentials undergo polarity reversals.

24. The detector as claimed in claim 22 wherein the first and second indicator means includes first and second extender means for maintaining the first and second digital indications when the potential at the probe means is intermittently within the first or second predetermined percentage.

25. The detector as claimed in claim 22 including means for applying an oscillating current signal to the probe means; and means responsive to a predetermined attenuation of the signal for providing an indication thereof thereby indicating continuity between the point and one of the source potentials.

26. A detector for determining continuity in an electrical circuit between a selected point in the circuit and a source in the circuit, said source having first, second, and third source potentials, comprising: probe means adapted to be placed in contact with the selected point; first, second, and third connector means adapted to be connected respectively to the first, second, and third source potentials; first indicator means connected to the probe and first connector means responsive to the potentials thereat to provide a first indication when the potential at the probe means is a first predetermined percentage of the potential at the first connector means thereby indicating acceptable continuity in the circuit between the point and the first source potential; second indicator means connected to the probe and second connector means responsive to the potentials thereat to provide a second indication when the potential at the probe means is a second predetermined percentage of the potential at the second connector means thereby indicating acceptable continuity in the circuit between the point and the second source potential; third indicator means connected to the probe and third connector means responsive to the potentials thereat to provide a third indication when the potential at the probe means is a third predetermined percentage of the potential at the third connector means thereby indicating acceptable continuity in the circuit between the point and third source potential.

27. The detector as claimed in claim 26 wherein the first, second, and third indicator means includes first, second, and third protective means for protecting the first, second, and third indicator means from damage when the first connector means is connected to the second or third source potential, or the second connector means is connected to the first or third source potential, or the third connector means is connected to the first or second source potential, or when the source potentials undergo polarity reversals.

28. The detector as claimed in claim 26 wherein the first, second, and third indicator means includes first, second, and third extender means for maintaining the first, second, or third indication when the probe means potential is intermittently within the first, second, or third predetermined percentage of the potential at the first, second, or third connector means, respectively.

29. The detector as claimed in claim 26 including means for floating the quiescent potential of the probe means at a potential between the first and second predetermined percentages.

30. The detector as claimed in claim 26 including means for floating the quiescent potential of the probe means at a potential between the second and third predetermined percentages.

31. The detector as claimed in claim 26 including means connected to the first and third connector means and the probe means for applying an oscillating current signal to the probe means; and means connected to the probe means responsive to a predetermined attenuation of the signal for providing an indication thereof thereby indicating continuity between the point and one of the source potentials.

32. A detector for determining continuity in an electrical circuit between a selected point in the circuit and electrical source in the circuit, said source having first and second source potentials, comprising: probe means adapted to be placed in contact with the selected point; first and second connector means adapted to be connected respectively to the first and second source potentials; first and second indication means connected respectively to the first and second connector means; first switching means connected to the probe means and the first indication means and operatively associated with the first connector means responsive to a potential at the probe means within a first predetermined fixed range of the potential at the first connector means to cause the first indication means to provide a first indication; and second switching means connected to the probe means and the second indication means and operatively associated with the second connector means responsive to a potential at the probe means within a second predetermined fixed range of the potential at the second connector means to cause the second indication means to provide a second indication.

33. The detector as claimed in claim 32 wherein the first and second switching means include first and second protective means for protecting the first and second switching means from damage when the first connector means is connected to the second source potential and the second connector means is connected to the first source potential or when the source potentials undergo polarity reversals.

34. The detector as claimed in claim 32 including means for maintaining the first or second indications when the potential at the probe means is intermittently within the first or second predetermined fixed range.

35. The detector as claimed in claim 32 including means for applying an oscillating current signal to the probe means; and means responsive to a predetermined attenuation of the oscillating signal for providing an indication thereof.

36. The detector as claimed in claim 32 including continuity indication means connected to the first connector means; oscillator means connected to the first and third connector means to convert a current flow therebetween to an oscillating current signal and connected to the probe means to impose the oscillating current signal thereon; rectification means connected to the probe means responsive to the oscillating current signal to provide an output proportional thereto; and comparator means connected to the rectification means and the continuity indication means responsive to a predetermined output from the rectification means to cause the continuity indication means to provide a continuity indication.

37. A detector for determining continuity in an electrical circuit between a selected point in the circuit and an electrical source in the circuit, said source having first, second and third source potentials, comprising:

probe means adapted to be placed in contact with the selected point; first, second, and third connector means adapted to be connected respectively to the first, second, and third source potentials; first indication means connected to the first connector means; second indication means connected to the first and third connector means; third indication means connected to the first indication means and the third connector means; first switching means connected to the probe means, the first indication means, and the first connector means responsive to a potential at the probe means within a first predetermined fixed range of the potential at the first connector means to cause the first indicator means to provide a first indication; second switching means connected to the probe means, the second connector means, and the second indication means responsive to a potential at the probe means within a second and third predetermined fixed ranges of the potential at the second connector means to cause the second indication means to provide a second indication; and third switching means connected to the probe means, the third connector means, and the third indication means responsive to a potential at the probe means within a fourth predetermined fixed range with the potential at the third connector means to cause the third indication means to provide a third indication.

38. The detector as claimed in claim 37 wherein the first and third indication means includes first and second protective means for protecting respectively the first and third switching means from damage when the first connector means is connected to the second or third source potential, or the second connector means is connected to the first or third source potential, or the third connector means is connected to the first or second source potential or when the source potentials undergo polarity reversals.

39. The detector as claimed in claim 37 including extender means connected to the first switching means and the first indication means for maintaining the first indication when the probe means potential is intermittently within the first predetermined fixed range; second extender means connected to the second switching means and the second indication means for maintaining the second indication when the probe means potential is intermittently within the second or third predetermined fixed range; and third extender means connected to the third switching means and the third indication means for maintaining the third indication when the probe means potential is intermittently within the fourth predetermined fixed range.

40. The detector as claimed in claim 37 including means for floating the quiescent potential of the probe means at a potential between the first and second predetermined fixed ranges.

41. The detector as claimed in claim 37 including means for floating the quiescent potential of the probe means at a potential between the third and fourth predetermined fixed ranges.

42. The detector as claimed in claim 37 including continuity indication means connected to the first connector means; oscillator means connected to the first and third connector means to convert a current flow therebetween to an oscillating current signal and connected to the probe means to impose the oscillating current signal thereon; rectification means connected to the probe means responsive to the oscillating current signal to provide an output proportional thereto; and comparator means connected to the rectification means and to the continuity means responsive to a predetermined output from the rectification means to cause the continuity indication means to provide a continuity indication.

43. A detector for determining continuity in an electrical circuit between a selected point in the circuit and a source in the circuit, said source having first, second, and third source potentials comprising: probe means adapted to be placed in contact with the selected point; first, second, and third connector means adapted to be connected respectively to the first, second, and third source potentials; first and third indication means connected respectively to the first and third connector means; second indicator means operatively associated with the second connector means; first switching means connected to the probe means, the first and second connector means, and the first indication means responsive to the potentials at the first and second connector means and the probe means to cause the first indication means to provide an indication when the potential at the probe means is a first predetermined percentage of the potential between the first and second connector means; second switching means connected to the probe means, the first and second and third connector means, and the second indication means responsive to the potential at the probe means and the first, second, and third connector means to provide a second indication when the potential at the probe means is a second predetermined percentage of the potential at the second connector means; third switching means connected to the probe means, the second and third connector means, and the third indication means responsive to the potentials at the second and third connector means and the probe means to cause the third indication means to provide a third indication when the potential at the probe means is a third predetermined percentage of the potential at the third connector means.

44. The detector as claimed in claim 43 wherein the first, second, and third indicator means includes first, second, and third protective means for protecting respectively the first, second, and third indicator means from damage when the first connector means is connected to the second or third source potential, or the second connector means is connected to the first or third source potential, or the third connector means is connected to the first or second source potential or when the source potentials undergo polarity reversals.

45. The detector as claimed in claim 43 wherein the first, second, and third indicator means includes first, second, and third extender means for maintaining the first, second, or third indication when the probe means potential is intermittently within the first, second, or third predetermined percentage of the potentials at the first, second, or third connector means, respectively.

46. The detector as claimed in claim 43 including means for floating the quiescent potential of the probe means at a potential between the first and second predetermined percentages.

47. The detector as claimed in claim 43 including means for floating the quiescent potential of the probe means at a potential between the second and third predetermined percentages.

48. The detector as claimed in claim 43 including continuity indicator means connected to the first connector means; oscillator means connected to the first and third connector means to convert a current flow therebetween into an oscillating current signal and connected to the probe means to impose the oscillating current signal thereon; rectification means connected to the probe means responsive to the oscillating current signal to provide an output proportional thereto; and comparator means connected to the rectification means and the continuity indication means responsive to a predetermined output from the rectification means to cause the continuity indication means to provide an indication.

* * * * *

UNITED STATES PATENT OFFICE
CERTIFICATE OF CORRECTION

Patent No. 4,031,461　　　　　Dated　21 June 1977

Inventor(s)　Carl Casper Reiner

It is certified that error appears in the above-identified patent and that said Letters Patent are hereby corrected as shown below:

Column 18, line 65, delete "2" and insert --22--.

Signed and Sealed this

Sixth Day of December 1977

[SEAL]

Attest:

RUTH C. MASON　　　　　LUTRELLE F. PARKER
*Attesting Officer*　　　*Acting Commissioner of Patents and Trademarks*